United States Patent [19]

Marcus et al.

[11] Patent Number: 5,475,318
[45] Date of Patent: Dec. 12, 1995

[54] MICROPROBE

[75] Inventors: Robert B. Marcus, 133 Colchester Rd., Murray Hill, N.J. 07974; William N. Carr, W. Milford, N.J.

[73] Assignees: Robert B. Marcus, Newark, N.J.; Roxburgh Ltd., Douglas, United Kingdom

[21] Appl. No.: 145,403

[22] Filed: Oct. 29, 1993

[51] Int. Cl.⁶ .................................................. G01R 31/02
[52] U.S. Cl. ........................ 324/762; 324/760; 324/761; 250/306; 251/11
[58] Field of Search ................................... 324/761, 762, 324/760; 250/310, 300; 310/317; 251/11

[56] References Cited

U.S. PATENT DOCUMENTS

| 4,749,942 | 6/1988 | Sang | 324/762 |
|---|---|---|---|
| 5,069,419 | 12/1991 | Jerman | 251/11 |
| 5,201,992 | 4/1993 | Marcus et al. | 156/643 |
| 5,268,571 | 12/1993 | Yamamoto | 250/306 |

OTHER PUBLICATIONS

Abrecht, T. R., Shinya Akamine, Mark J. Zdeblich and Calvin F. Quate, Microfabrication of Integrated Scanning Tunneling Microscope, J. Vac. Sci. Technol. A8(1), Jan./Feb. 1990.
R. B. Marcus, T. S. Ravi and T. Gmitter, K. Chin, D. Liu, W. J. Orvis and D. R. Ciarlo, C. E. Hunt and J. Trujillo, 1990, Formation of Silicon Tips with <1 nm radius, Appl. Phys. Lett. 56(3), Jan. 1990.
R. B. Marcus, T. S. Ravi, T. Gmitter, H. H. Busta, J. T. Niccum, K. K. Chin and D. Liu, Atomically Sharp Silicon and Metal Field Emitters, 1991, IEEE Transactions on Electron Devices, vol. 38, No. 10, Oct. 1991.
R. A. Buser and N. F. de Rooij, H. Tischhauser, A. Dommann and G. Staufert Biaxial Scanning Mirror Activated by Bimorph Structures for Medical Applications Sensors and Actuators A, 31 (1992) 29–34, pp. 29–34.
S. R. Weinzieri, J. M. Heddleson, R. J. Hillard, P. Rai–Choudhury, R. G. Mazur, C. M. Osburn, Paul Potyraj, Ultrashallow Dopant Profiling Via Spreading Resistance Measurements with Integrated Modeling, Jan. 1993, Solid State Technology, pp. 31–38.
R. G. Mazur, G. A. Gruber, Dopant Profiles on Thin Layer Silicon Structures with the Spreading Resistance Technique, Solid State Technology, Copyright Nov. 1981.
J. Brugger, R. A. Buser and N. F. de Rooij, Silicon Cantilevers and Tips for Scanning Force Microscopy, Sensors and Actuators A, 34 (1992) 193–200.
T. R. Albrecht, S. Akamine, T. E. Carver, and C. F. Quate, Microfabrication of Cantilever Styli for the Atomic Force Microscope, J. Vac. Sci. Technol. A8(4), Jul./Aug. 1990, pp. 3386–3396.
W. Benecke and W. Riethmuller, Applications of Silicon–Microactuators Based on Bimorph Structures, THO249–3/89/0000/0025$1.00 1989 IEEE, pp. 116–120.
Mark Beiley, Faith Ischishita, Cuong Nguyen, and Simon Wong, Array Probe Card, May 1992, $3.00 1992 IEEE, pp. 28–31.
Cantilevers with Ultra–Sharp Tips for Scanning Force Microscopy Park Scientific Instruments Brochure (undated).
Dr. Olaf Wolter, Nanoprobe Brochure (undated).

*Primary Examiner*—Kenneth A. Wieder
*Assistant Examiner*—Mark Wardas
*Attorney, Agent, or Firm*—Meltzer, Lippe, Goldstein, et al.

[57] ABSTRACT

A microprobe comprises a base, a microcantilever extending in a plane from the base, and a probe tip projecting from the microcantilever out of the plane. The microcantilever is a bimorph structure comprising first and second layers made from materials having different coefficients of thermal expansion, and an integrated heated element for supplying heat to the microcantilever. The probe tip is made from silicon and comes to a radius that can be controlled to atomic sharpness (<1 nm) if desired. Alternatively, the probe tip is a planar structure. Desirably, the microcantilever is made from a metal, such as aluminum, and silicon oxide as the materials of the two layers. The heating element comprises a line or ribbon of a conductive material, such as polysilicon which is in contact with one of the two layers, and supplies heat, thereby causing the probe tip to traverse an arc and bring it into contact with a material under investigation.

36 Claims, 7 Drawing Sheets

FIG. 2
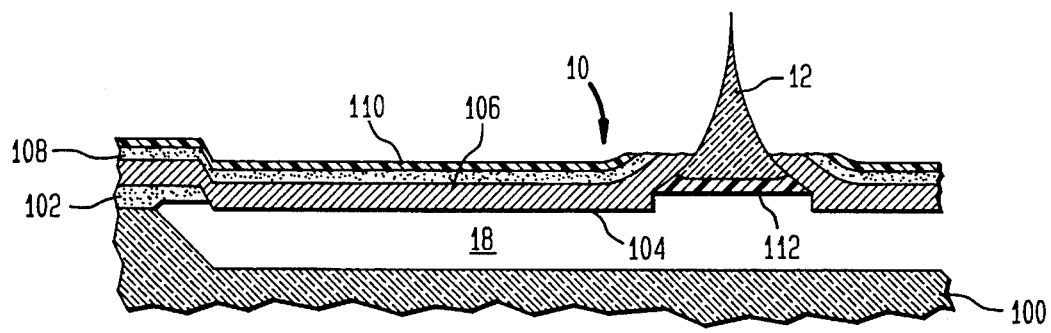
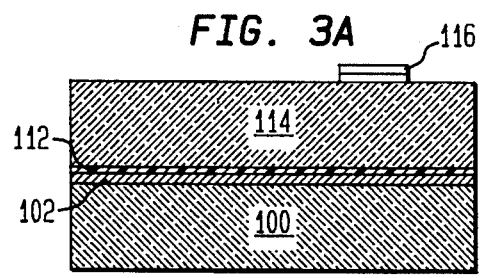
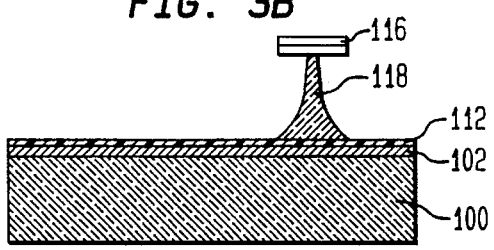
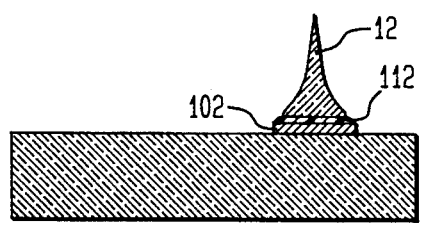
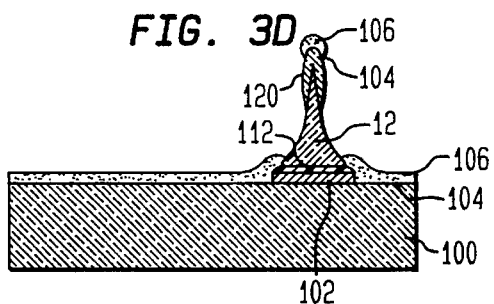
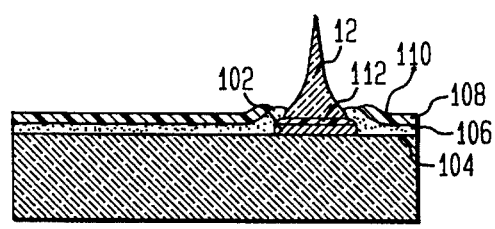
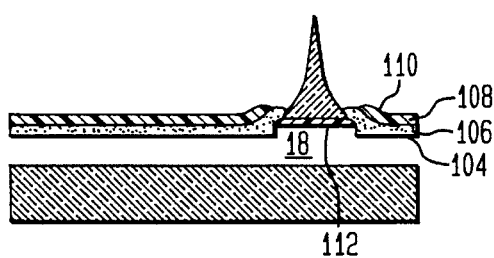

MICROPROBE

BACKGROUND OF THE INVENTION

The present invention is in the field of microelectromechanical systems (MEMS). More particularly, the present invention relates to a microcantilever. In one of its aspects, the present invention is directed to a microprobe which incorporates the microcantilever and which is used for high resolution material characterization. In another of its aspects, the present invention is directed to a conformable, high-pin count, programmable wafer probe (called a CHIPP probe card) which incorporates an array of the microcantilevers for device characterization.

Recently, a great deal of effort has been expended to develop electromechanical devices, such as sensors and actuators, on a microscopic scale. Many of the techniques developed over the years for silicon chip processing have been used to produce these microelectromechanical devices. These techniques include photolithography, X-ray and e-beam lithography, layer deposition and etching techniques, etc. For example, these techniques have been used to produce atomically sharp tips which can be used as electron emitters in microelectronic devices, or as mechanical, electrical, or magnetic microsensors or microprobes.

In an article by R. B. Marcus et al, appearing in *Appl. Phys. Lett.*, 56(3), p. 236 (1990), a method is described for preparing uniform silicon tips having a radius of curvature of less than 1 nm. The process described therein involves producing silicon cones by isotropic etch, followed by oxidation in wet $O_2$ for 15 minutes at 900° C. This treatment results in silicon cones that are about 5 μm high and have slightly rounded tips of diameter 25–150 nm. These silicon cones are then subjected to dry oxidation at 950° C. for periods of 2–5.5 hours, followed by removal of the oxide layer on the tip. This oxidation sharpening leaves the silicon cones with atomically sharp tips having a radius of curvature of less than 1 nm. A similar process is disclosed by R. B. Marcus et al, in *IEEE Trans. El. Dev.*, 38 (10), p. 2289 (1992), wherein the atomically sharp silicon tips are plated with tungsten and gold. The silicon tips described in these two articles are useful as electron emitters in vacuum microelectronic devices.

In *Sensors and Actuators A*, 34, p. 193–200 (1992), J. Brugger et al disclose a method for producing monocrystalline silicon cantilevers with integrated silicon tips. These microcantilevers are produced by micro-machining techniques. They are described as being useful as microprobes to measure friction during atomic force microscopy (AFM). This article also describes the fabrication of an array of such microprobes which enables multiple parallel or serial surface profiling to be achieved.

Similarly, T. R. Albrecht et al, in *J. Vac. Sci. Tech. A*, 8 (4), p. 3386 (1990), also disclose a method of fabricating sharp Si tips on microcantilevers for use in atomic force microscopy. Additionally, Park Scientific Instruments, Inc., of Sunnyvale, Calif., sells Si cantilevers with Si tips for use in atomic force microscopy, and the Nanoprobe company of Germany also sells cantilevers with Si tips for atomic force microscopy. Only the Albrech et al. device includes an actuator integrated with the cantilever, although the mechanism for actuating the cantilevers is not described.

In *J. Vac. Sci. Tech. A.*, 8 (1), p. 317 (1990), T. Albrecht et al disclose a process for microfabricating arrays of scanning tunnelling microscopes (STM) on silicon wafers. Each scanning tunnelling microscope comprises a tunneling tip projecting from a piezoelectric actuator. The actuator is in the form of a bimorph cantilever constructed from alternating layers of multiple metallic electrodes, dielectric films, and piezoelectric zinc oxide films.

In addition to the above, W. Benecke et al, in *Proc. MEMS (IEEE)*, Napa Valley, Calif., Feb. 11–14, 1990, disclose a silicon-based cantilever-type microactuator. The cantilever comprises a bimorph structure with an integrated heating resistor as a driving element. Similarly, R. A. Buser et al, in *Sensors and Actuators*, A 31, p. 29 (1992), disclose a micromachined scanning mirror having bimorph actuation. However, neither of the bimorph actuated beams in these two references has a silicon tip which projects from the beam.

Additional to the above, S. R. Weinzierl et al, in *Solid State Technology*, p. 31 (January 1993), and R. G. Mazur et al., in *Solid State Technology* (November 1981) disclose, spreading resistance probes, while M. Beily et al, in *Proc. 1992 IEEE International Test Conference* (1992), disclose an array probe card in the form of a very large number of probe tips made from tungsten fixed on a transparent, flexible membrane.

It can be seen from the above that a great deal of work has been done in producing microcantilevers of various shapes, structures, and compositions. However, up to the present time, no one has produced a microprobe comprising a microcantilever having a probe tip projecting from the microcantilever, wherein the microcantilever is of bimorph construction with an integrated heating element.

Accordingly, it is an object of the present invention to provide a microprobe comprising a bimorph actuated microcantilever having a probe tip which projects from the microcantilever. The probe tip may be atomically sharp or less sharp. Upon heating of the microcantilever, the probe tip comes into contact with a material to be investigated.

It is a further object of the present invention to provide a process for making such a microprobe.

It is yet another object of the present invention to incorporate an array of the inventive microprobe into an integrated probe card, wherein each of the microbes in the array can be individually addressed and actuated.

It is another object of the invention to provide multiple (2 or 4) closely-spaced tips on a single cantilever for high-resolution resistivity measurements.

SUMMARY OF THE INVENTION

These and other objects of the invention are achieved by means of the present invention which provides a microprobe comprising a base, a microcantilever extending in a plane from the base, and a probe contact projecting from the microcantilever out of the plane. In one embodiment, the probe contact is a sharp tip, while in another embodiment, the probe contact is a planar tip. The microcantilever is a bimorph structure comprising first and second layers made from materials having different coefficients of thermal expansion, and an integrated heating element as an actuator for supplying heat to the microcantilever. When the probe contact is a sharp tip, the probe tip is made from silicon and comes to a radius that can be controlled to atomic sharpness (radius of <1 nm.) Desirably, the bimorph microcantilever is made from a metal, such as aluminum, and silicon oxide as the materials of the two layers. The heating element comprises a line or ribbon of a conductive material, such as polysilicon which is in contact with one of two layers, and supplies heat, thereby causing the probe tip to traverse an arc and bring it into contact with a material under investigation. Alternatively, the microcantilever is a piezoelectric (electrostrictive) thin film element which is actuated (i.e., caused to traverse an arc) by impressing a voltage across the piezoelectric film.

The inventive microprobe is a monolithic structure, i.e., is fashioned from a single piece of semiconductor using the techniques of silicon chip processing.

In a preferred embodiment of the invention, an array of the individually addressable microprobes of the kind described above are fashioned out of a silicon wafer and are connected by appropriate leads to the outside world so as to form a wafer probe card. This array may comprise as many as 15,000 individual microprobes per $cm^2$ of the kind described above.

BRIEF DESCRIPTION OF THE DRAWINGS

FIG. 2 is a cross-sectional view of the inventive microprobe.

FIGS. 3a–3f schematically illustrate a process for producing the inventive microprobe shown in FIGS. 1 and 2.

DETAILED DESCRIPTION OF PREFERRED EMBODIMENTS

Figure 1:
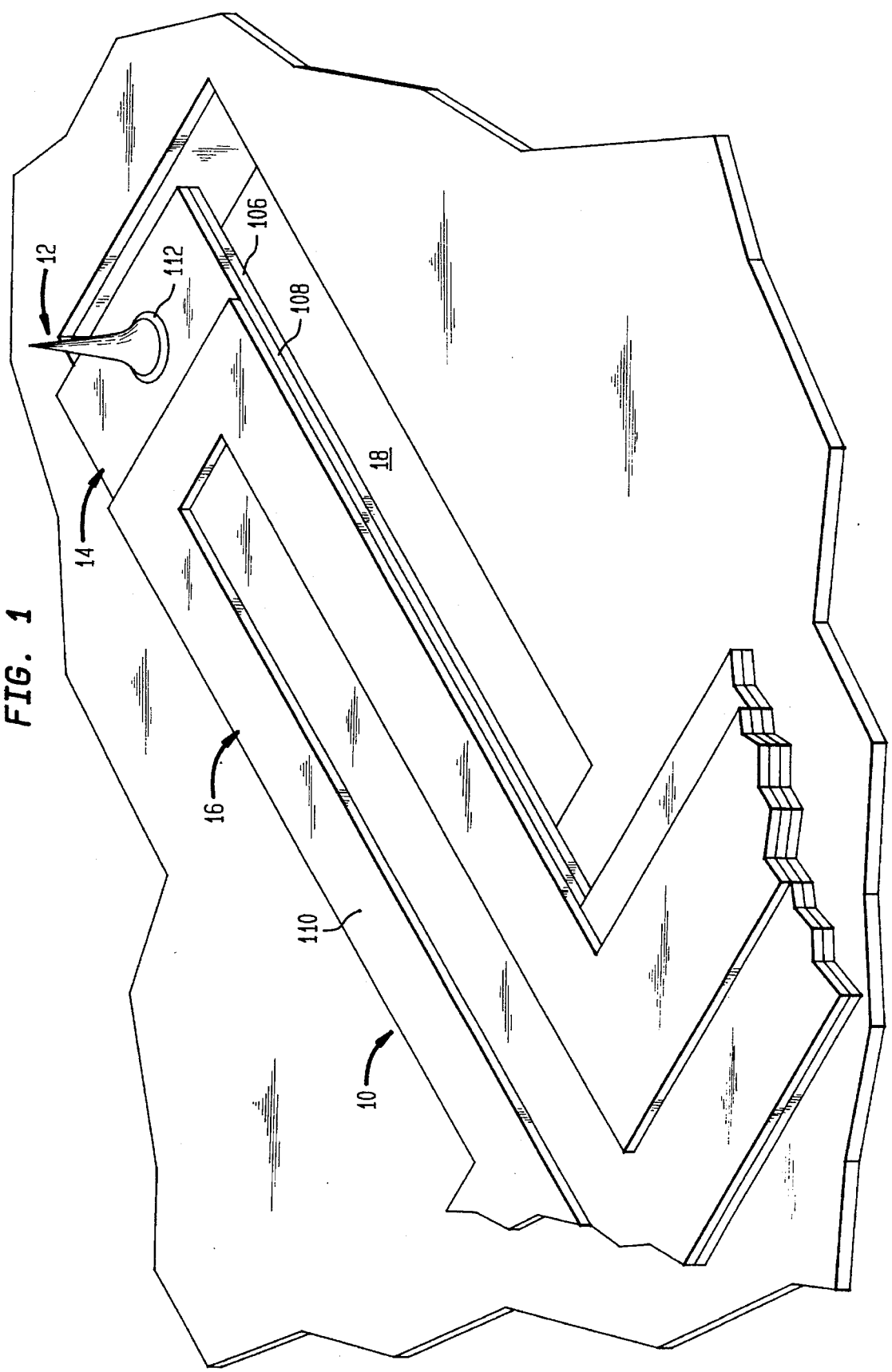
FIG. 1 is a perspective view illustrating a microprobe in accordance with the present invention.

Referring first to FIG. 1, the basic structure of one embodiment of the inventive microprobe is illustrated. The basic microprobe structure 10 shown in FIG. 1 comprises a single probe tip 12, a bimorph cantilever 14, and a heating element 16. The bimorph 14 is a dual layer cantilever or beam which projects outwardly from a base area and is suspended over an air gap 18. Instead of a bimorph cantilever and a heating element, the cantilever can comprise a beam made from a piezoelectric material which is actuated by the passage of electric current. Typically, the cantilever 14 is about 200–600 μm long and about 20–30 μm wide. The probe tip 12, which is made from silicon, is about 5 μm long. The sharpness of the point of the silicon tip 12 can be varied. In the embodiment illustrated in FIG. 1, the point of probe tip 12 is very sharp (radius of less than 1 nm, typically about 0.5 nm), which enables it to break through surface oxides when functioning to probe material surface characteristics. In other embodiments to be described below, the probe tip is a planar structure. The air gap 18 is about 10 μm wide.

The bimorph structure of cantilever 14 comprises a layer of aluminum 106 that is about 1.5 μm thick and a layer 108 of $SiO_2$ that is about 1 μm micron thick. A ribbon of conductive polysilicon 110 about 0.5 μm thick constitutes the heating element 16. Due to the differences in the coefficient of thermal expansion of Al and $SiO_2$, the cantilever 14 illustrated in FIG. 1, which is 200 μm long and 20 μm wide, will traverse an arc corresponding to a vertical distance of about 10 μm when supplying 50 mW power to the heating element 16 thereby raising the bimorph temperature to 150° C. The same temperature can be obtained, and the same distance can be traversed by cantilever 14, with a heating power of only 150 μW in a vacuum of $10^{-4}$ Torr. Thus, probing in vacuum is far more efficient than probing in air.

Greater distances can be traversed if cantilever 14 is made longer. For example, a vertical distance of 50 μm can be traversed if the cantilever is 500 μm long. In all cases, the direction of travel of cantilever 14 is upward as shown in FIG. 1, i.e., away from air gap 18. However, it is possible to construct the microcantilever with the layers 106 and 108 reversed and with the probe tip 12 pointed downward. In that case, the direction of travel will be downward, referring to FIG. 1.

Referring now to FIG. 2, a cross sectional view of the basic microprobe structure 10 of FIG. 1 is shown. This structure comprises a silicon substrate 100 on which various layers have been deposited and etched away in selected locations to provide the microprobe structure shown in FIGS. 1 and 2. These layers include a layer 102 of $SiO_2$ that is about 0.4 μm thick, a layer 104 of Pd that is about 200 Å thick, the layers 106 and 108 of Al and $SiO_2$ respectively which constitute the bimorph actuator, and the layer 110 of polysilicon which constitutes the integrated heating element of the bimorph actuator. In addition, underneath and extending for a distance along the sides of the probe tip 12 is a layer 112 of $p^{++}Si$ which has been doped with boron. It will be recognized that FIGS. 1 and 2 illustrate only one of an array of microprobes that can be formed in substrate 100 by standard silicon processing techniques.

FIGS. 3a–3f illustrate a series of silicon processing steps which may be used to produce the basic microprobe structure 10 shown in FIGS. 1 and 2 as well as other similar microprobes in substrate 100. It should be understood that the series of silicon processing steps diagrammatically illustrated in FIGS. 3a–3f are illustrative only. A different series of steps may also be used to produce the final structure.

Referring first to FIG. 3a, the starting material consists of the single crystal silicon substrate 100, on top of which is a layer of $SiO_2$ 102 buried beneath the surface, and which has been formed by oxygen implantation. The silicon on top of the $SiO_2$ layer 102 is the layer 112 of boron doped $p^{++}Si$, and on top of this is a layer 114 of epitaxially deposited silicon. The desired silicon probe tip 12 of FIG. 3f will be formed from the epitaxially deposited silicon 114, using the $SiO_2$ mask 116 of FIG. 3b is placed on the epi Si at the location beneath which the probe tip 12 will be formed. Alternatively, the same structure may be formed by oxygen implantation into silicon, melting and recrystallization of a polysilicon film on an oxidized wafer, wafer bonding, or by any other recognized method.

In the first step of the process, the starting materials shown in FIG. 3a are subjected to either a one-step or a two-step etching process to remove most of the layer 114 of epi Si except under mask 116 and thereby begin the formation of probe tip 12. A two-step etching process is preferred since it results in a probe tip having a higher aspect ratio than a one-step etching process. In the two-step process illustrated in FIG. 3b, the starting materials are first subjected to a dry etching process using $SiF_xCl_y$ gas at an elevated temperature (e.g., 400°–600° C.), to remove some of the epi Si layer. In the second step of the initial etching process illustrated in FIG. 3b, the materials are subjected to either anisotropic liquid etching using KOH, or else isotropic liquid etching using a combination of HF, $HNO_3$, and $CH_3COOH$, to begin the formation of probe tip 12. The liquid etchant attacks from the sides underneath mask 116 leaving a structure similar to that shown in FIG. 3b under oxide mask 116. If isotropic etching is used, the sides of probe tip 12 are rounded, while anisotropic etching will produce square sides on probe tip 12 for the case where the silicon wafer was oriented with the (100) crystal-lographic plane parallel to its surface.

The oxide mask 116 is next removed using HF. Thereafter, the projection 118 is sharpened into probe tip 12 using the oxidation techniques described in the publications of R. B. Marcus et al. For example, the projection 118 is subjected to oxidizing at temperatures in the range 850° C.–1,050° C. for periods of 2–5 hours. Thereafter, the oxide layers which have been produced are removed by standard techniques described in these publications. The resulting structure is shown in FIG. 3c. Alternatively, in cases where a tip with less curvature is desired, the radius can be increased by high-temperature oxidation (<1050° C.), anodization, or etching.

Up to this point, the atomically sharp probe tip 12 has been formed with layers 102 of $SiO_2$ and 112 of $p^{++}Si$ underneath probe tip 12. It is now necessary to form the cantilever 14 from which probe tip 12 will project. This is accomplished in a series of steps between FIG. 3c and FIG. 3d. The first step is to deposit another oxide mask 120 on the surface of substrate 100 and on probe tip 12 using CVD (chemical vapor deposition) techniques. Thereafter, this oxide mask 120 is removed everywhere except from the probe tip 12. Thus, an oxide mask 120 is left on the probe tip 12 only.

Next, a layer 104 of Pd is deposited directly from above using a Pd vapor. The purpose of layer 104 (not shown in FIG. 1) is to protect the underside of the aluminum layer (which will be deposited next) from a subsequent etching step. As the layer 104 is deposited directionally from above, it will cover all exposed surfaces along a line of sight from above, i.e., it does not cover fully the probe tip 12 or the oxide mask 120.

In the next step, a layer of aluminum 106 is deposited directionally from above in the same manner as layer 104. Again, this covers all surfaces along a line of sight from above. It will be noted that the Al and Pd layers 106 and 104 respectively do not cover the entire probe tip 12 but only cover the top of the oxide mask 120 located on top of probe tip 12. Furthermore, although not illustrated in FIG. 3d, the Al and Pd layers are deposited in a dimensionally patterned manner so as to be present only in the regions where cantilever 14 is to be located. The resulting structure is shown in cross-section in FIG. 3d.

Figure 5:
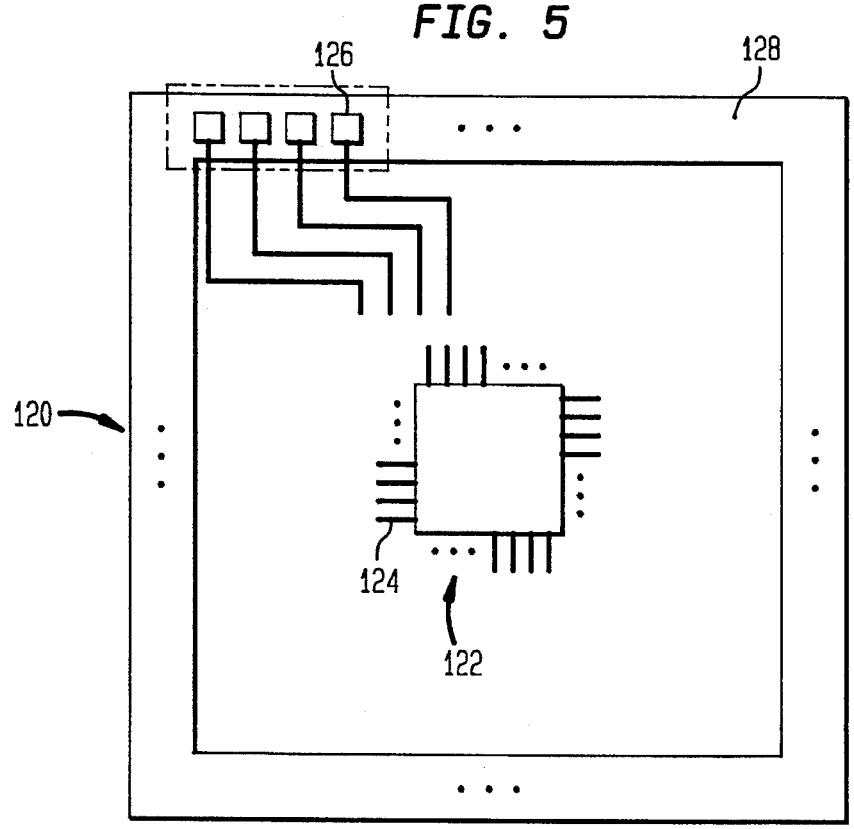
FIG. 5 illustrates a wafer probe card incorporating an array of the inventive microbes.

Following this, the layer 108 of $SiO_2$ is deposited over the entire surface, followed by the layer 110 of polysilicon as shown in FIG. 3e. The polysilicon layer 110 forms the heating element for the bimorph structure and therefore must be deposited in a dimensionally patterned manner so as to be present on the surface only in desired locations. Next, the resulting structure is etched with HF. Because the oxide layer 120 of FIG. 5 is exposed along the sides of the probe tip 12, this oxide layer 120, as well as all layers on top of it, are removed. The resulting structure is illustrated in FIG. 3e wherein the probe tip 12 again has an atomically sharp tip.

Finally, it is necessary to create the cantilever by forming an air gap under the region that is to become the cantilever. This may be accomplished by depositing yet another mask (not illustrated) of either $SiO_2$ or photoresist in a patterned manner. The structure is then subjected to RIE etching in order to remove some of the Si in substrate 100 and the $SiO_2$ in layer 102 underneath probe tip 12. Next, the Si in substrate 100 is further etched with a liquid etch. The liquid etches in a lateral direction under the patterned mask on the surface thereby forming an air gap 18 and creating the cantilever. In this manner, the cantilever 14 is formed only in desired locations. The patterned mask, whether made from $SiO_2$ or photoresist is removed by standard techniques. The resulting structure is illustrated in FIG. 3f which corresponds with the cantilever structure shown in FIGS. 1 and 2.

The microprobe 10 shown in FIGS. 1 and 2 is suitable for providing controlled, compliant contact of a probe point to a device pad or device region with the force required for ohmic contact. Bending action is created through Joule heating of the bimorph elements that comprise the cantilever.

Numerous variations of the basic microprobe structure shown in FIGS. 1 and 2 are possible in order to carry out direct measurements of material properties on device features, such as spreading resistance, Hall mobility, and van der Pauw resistivity. For example, instead of a single probe tip per cantilever, it is possible to fashion the microprobe with a plurality of probe tips on each cantilever. The probe tips can be spaced very closely together (e.g., less than 1.0 µm apart) so that all of them will be actuated together and together they will probe a very small region of a material under investigation. The multiple probe tips can be aligned in a linear array or otherwise to provide multiple contacts to a power pad in order to distribute the power load so that the power-carrying capability of a single tip will not be exceeded. Also, it will not matter very much if one of the probe tips breaks off. The ultrasharp point tips offer the advantage of ease in breaking through surface oxide layers to achieve ohmic contact to the underlying pad or contact material. Furthermore, in order to increase the strength of the probe tips, it is possible to coat them with a layer of tungsten or silicon carbide. The processing steps outlined in FIGS. 3a–3f can be easily adapted to produce these variations of the basic microprobe structure.

Figure 4:
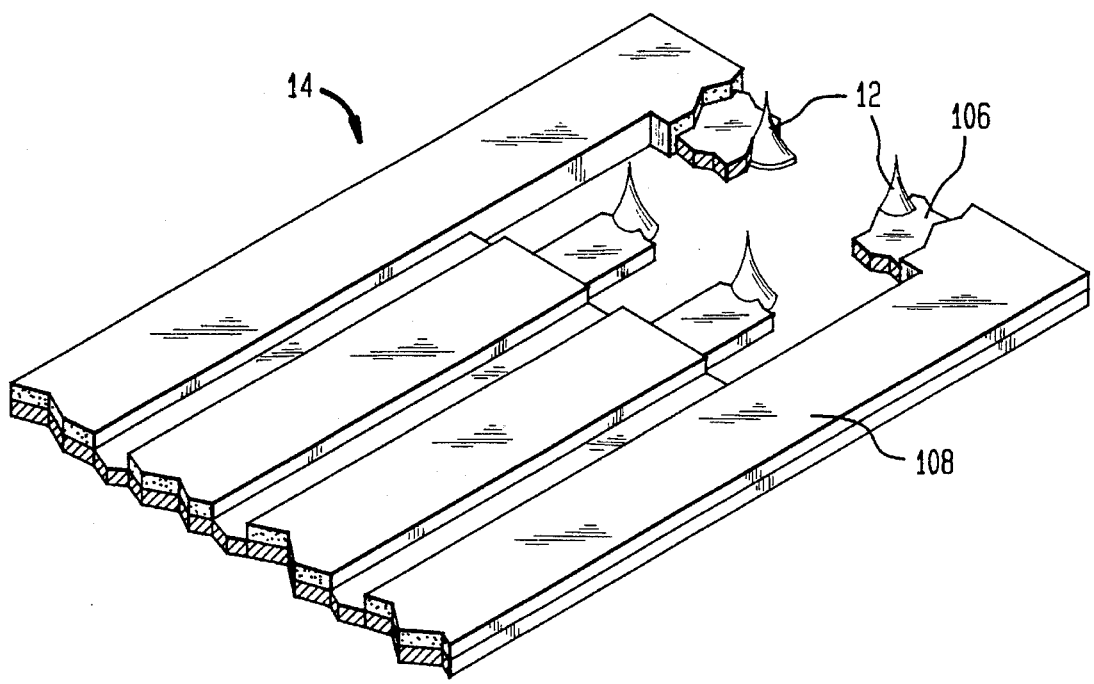
FIG. 4 illustrates another embodiment of the invention for probing resistivity of materials.

FIG. 4 illustrates another embodiment of the invention wherein four probe tips 12 at the end of a single cantilever 14, are grouped together. This arrangement is useful for measuring the bulk resistivity of a material by the van der Pauw method, wherein four closely spaced contacts must be made with the material under investigation. The four probe tips 12 shown in FIG. 4 are located at the corners of a square with a spacing of <1.0 µm between them. In this embodiment, each probe tip 12 extends from an isolated layer 106 of Al rather than from a combined layer of Al and the layer 108 of $SiO_2$. This is done because it is impossible to ensure that each probe tip is exactly the same height and therefore makes contact with the device under investigation at exactly the same time. In order to add a degree of compliance to the microprobe, the $SiO_2$ layer 108 is stopped short and the probe tip 12 is placed on the springier layer 106 made from Al. Thereby, it can be ensured that each of the four probe tips 12 shown in FIG. 4 makes ohmic contact with the device under investigation when making van der Pauw resistivity measurements.

Figure 6:
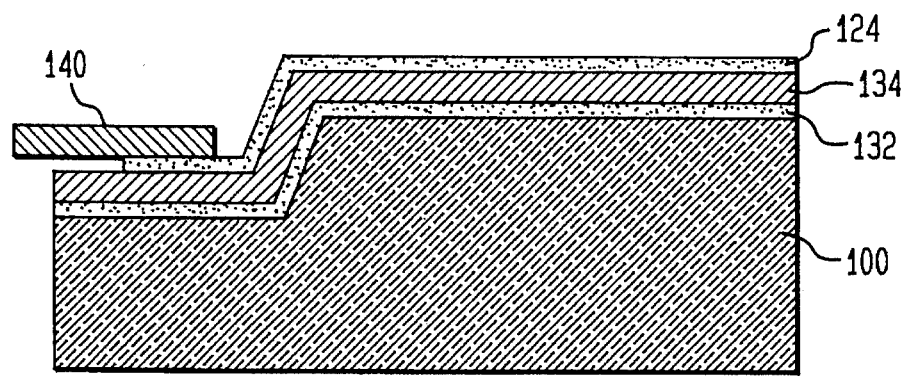
FIGS. 6–7 are cross-sectional views of one portion of the wafer probe card shown in FIG. 5.
Figure 7:
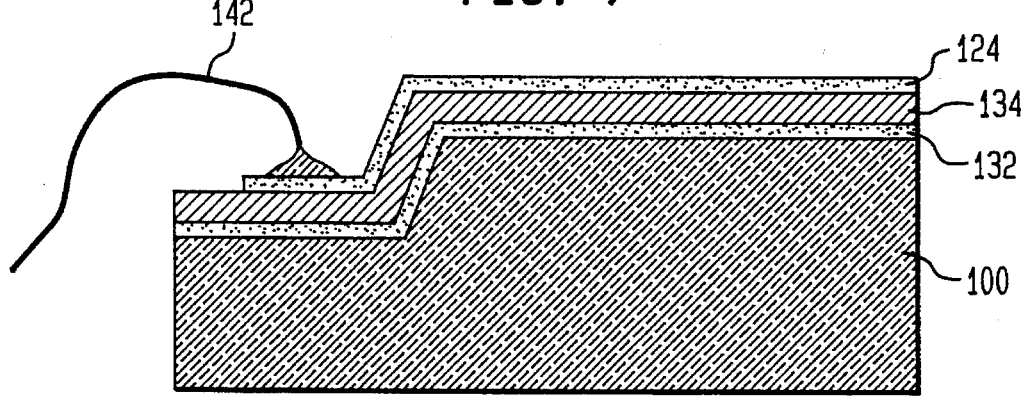

FIGS. 5–7 schematically illustrate another embodiment of the invention. In FIGS. 5–7, an array of the microprobes shown in FIGS. 1 and 2 are incorporated into a single wafer probe card 120. The wafer probe card 120 (also referred to as CHIPP probe card) is suitable for wafer probing/testing of chips on a wafer, chip packages and multi-chip modules. In the wafer probe card 120, an array of cantilevers, each with a single point tip (or multiple-point tips for power pads), is arranged in a central region 122 that may be, e.g., 1 cm×1 cm. The cantilevers are each about 200 μm×20 μm, and spaced apart from an adjacent cantilevers by 10 μm. The cantilevers can be arranged around the periphery of central region 122, in which case about 333 cantilevers can be located on a side, giving a total of 1332 cantilevers. Alternatively, the cantilevers can fill up the entire central region 122, in which about 14,000–15,000 cantilevers can be contained in central region 122. In either case, each microprobe in central region 122 is capable of testing small (less than 25 μm) pads with over 1332 pads per cm$^2$.

Each of the microprobes in the central region 122 has two leads 124 connecting to two of the micropads 126 located on a perimeter region 128 of the wafer probe card 120. One of the leads is a polysilicon line leading to the first leg of heating element shown in FIGS. 1 and 2 (the second leg of the heating element leading to the ground plane at a location not shown in the drawings). The second lead is a probe line which connects to the Al layer of the microprobes shown in FIGS. 1 and 2. Because each of the two leads from each microprobe connects to a separate pad 126, each of the microprobes is individually addressable.

The wafer probe card 120 is nominally 6 cm×6 cm on each side. As is evident from FIGS. 6 and 7, the recessed region 128 containing the micropads 126 is at a lower height than the central region 122. The wafer probe card 120 is fabricated in this manner, i.e., with a recessed region 128, in order to ensure that the array of microprobes makes good contact with the wafer being tested without interference from the leads 140 and 142 (FIGS. 6, 7) connecting to the micropads 126. In another embodiment, the recessed region may be located just outside the central region 122.

FIG. 6 is a cross-sectional view showing the different layers of material in wafer probe card 120 near its edge. Thus, the wafer probe card comprises the substrate 100, on top of which is a layer 132 of a conductive material, such as a metal or polysilicon, which functions as a groundplane. Above the groundplane 132, is a layer 134 of dielectric material, such as SiO$_2$, and on top of this is the lead 124 connecting to one of the cantilevers in the central region 122. The manner in which the region 128 is recessed from the plane of wafer probe card 120 is quite evident in FIG. 6. A bonded wire 140 is shown interconnected with one of the micropads 126 along the peripheral region 128.

FIG. 7 is quite similar to FIG. 6 except that in this embodiment, a bonded tab 142 is interconnected with the micropad 126.

The wafer probe card 120 having an array of microprobes thereon is Conformable to curved surfaces or to contacts of varying height, can probe pads 25 μm and smaller on chips with High Pin-count, and is Programmable for individual actuation of the microprobes. Hence, the name CHIPP probe has been applied to this probe card. It is useful for probing/testing different chip designs.

Figure 8A:
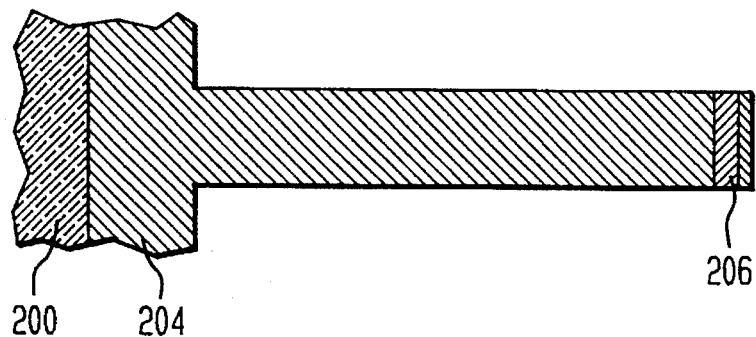
FIGS. 8a–8c are views of another embodiment of the microprobe of the present invention.
Figure 8B:
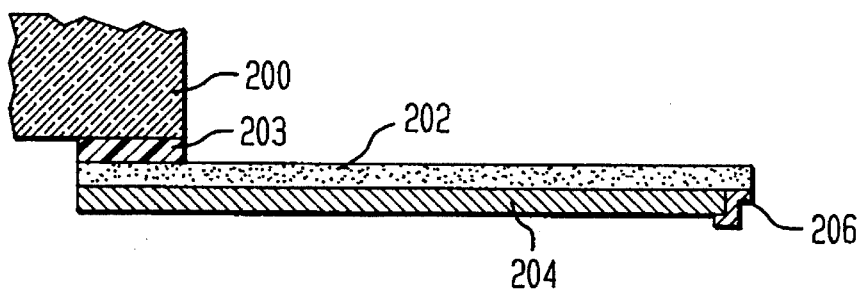
Figure 8C:
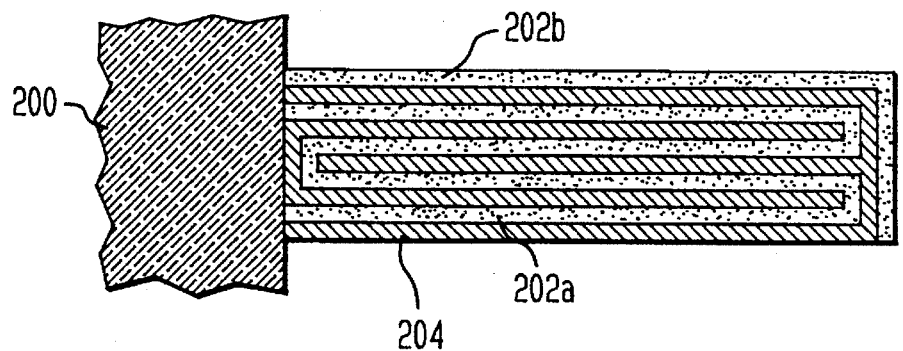

FIGS. 8a–8c illustrate another embodiment of the basic microprobe structure having a flat-surface contact area at the end of the cantilever. This flat-surface contact area functions as a probe contact. FIG. 8a is an underside view, FIG. 8b is a side view, and FIG. 8c is a top view of this embodiment of the basic microprobe structure. As best seen in FIGS. 8a and 8b, the cantilever (which is, e.g., 200 μm long and 20 μm wide) comprises a layer 202 of aluminum and a layer 204 of SiO$_2$ projecting outwardly from the silicon substrate 200. At the end of the cantilever is a contact zone 206 which is flat instead of being sharp as in the embodiment of FIGS. 1 and 2. It can be seen from FIGS. 8a and 8b that the polysilicon layer, which functions as the heating element in the embodiment shown in FIGS. 1 and 2, is omitted from the embodiments of FIGS. 8a and 8b. Instead, the heating element is integrated into the aluminum layer 202 as will be described below.

FIG. 8c is a top view of the embodiment shown in FIGS. 8a and 8b. FIG. 8c illustrates that the aluminum layer 202 simultaneously serves three functions: i) it serves as the high-thermal expansion coefficient part of the bimorph, ii) a portion 202a serves as the heating element, and iii) a portion 202b serves as the signal line to the contact.

The embodiment shown in FIGS. 8a–8c offers two main advantages over the embodiment of the inventive microprobe shown in FIGS. 1 and 2. The flat surface-type contact offers greater mechanical stability and reliability than the sharp probe tip shown in FIGS. 1 and 2. Furthermore, it is far easier to manufacture a microprobe with a flat contact tip than the delicate probe point of the embodiment in FIGS. 1 and 2.

The flat probe contact 206 is made from silicon, but, desirably, is covered with a metal such as tungsten, or with a conducting carbide such as SiC, or another hard, abrasive material such as conducting diamond. A metal covering will provide a better contact with the sample. A hard-abrasive contact such as SiC or conducting diamond will provide even better contact by abrading through any oxide or contamination on the surface of the pad with which contact is being made.

Figure 9A:
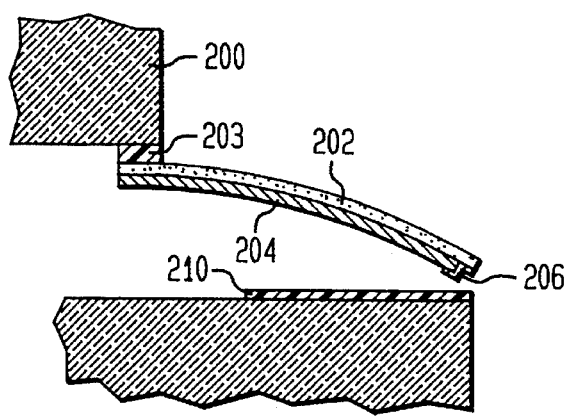
FIGS. 9a–9b are views of another embodiment of the inventive microprobe.
Figure 9B:
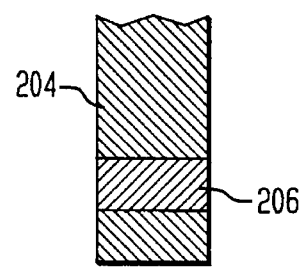

FIGS. 9a and 9b show a side view and a bottom view respectively of a microprobe similar to that illustrated in FIGS. 8a–8c. FIG. 9a shows the microprobe in use making contact with the contact pad 210. Thus, in FIG. 9 the cantilever comprising the layers 202 and 204 have been caused to traverse an arc and make contact with the contact pad 210. It will observed that the contact with contact pad 210 is along a line. This provides superior results to the microprobe shown in FIGS. 1 and 2 which only provides point contact with the contact pad 210.

Figure 10A:
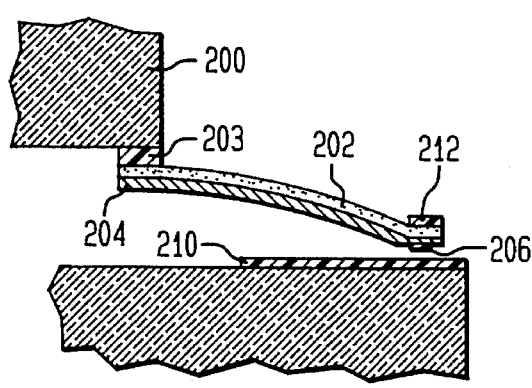
FIGS. 10a–10b are views of another embodiment of the inventive microprobe.
Figure 10B:
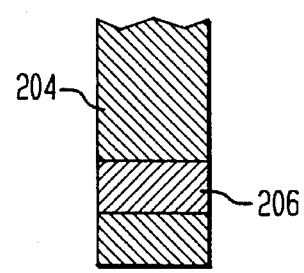

FIGS. 10a and 10b show side and bottom views respectively of yet another embodiment of the microprobe. In the embodiment shown in FIGS. 10a and 10b, there is an additional layer 212 of SiO$_2$ on top of the aluminum layer 202, and a significantly thinner layer 204 of SiO$_2$ under the aluminum layer in the region of the contact 206. This arrangement produces active bimorph bending in a direction opposite to the direction of the bending of the cantilever, thereby resulting in a planar contact with the contact pad 210. The ohmic contact in this actively-aligned planar configuration is superior to the ohmic contact of the line of contact provided by the embodiment shown in FIG. 9a.

Figure 11A:
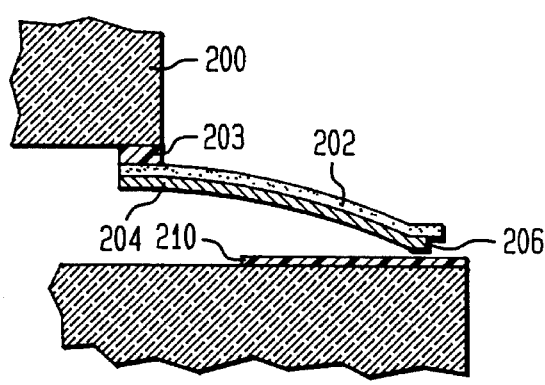
FIGS. 11a–11b are views of another embodiment of the inventive microprobe.
Figure 11B:
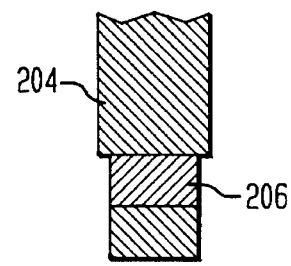

FIGS. 11a–11b show side and bottom views respectively of yet another embodiment of the inventive microprobe. In the embodiment of FIGS. 11a and 11b, the probe contact 206 is made narrower than the layer 204 so that the probe contact 206 is more compliant than the cantilever. The pressure of the cantilever on the contact pad 210 of the sample bends the probe contact 206, resulting in a planar contact with the sample, similar to the planar contact of the embodiment of

FIG. 10a.

Figure 12A:
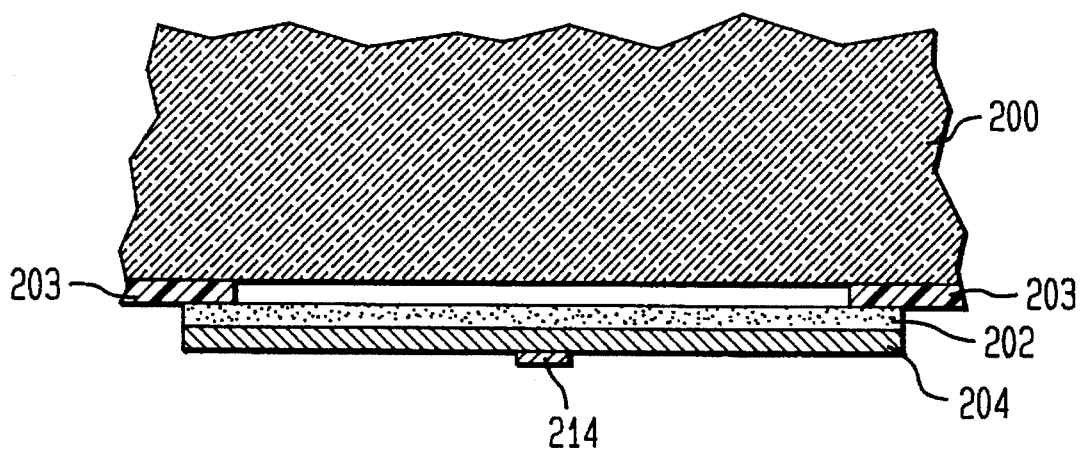
FIGS. 12a–12b are views of yet another embodiment of the inventive microprobe.
Figure 12B:
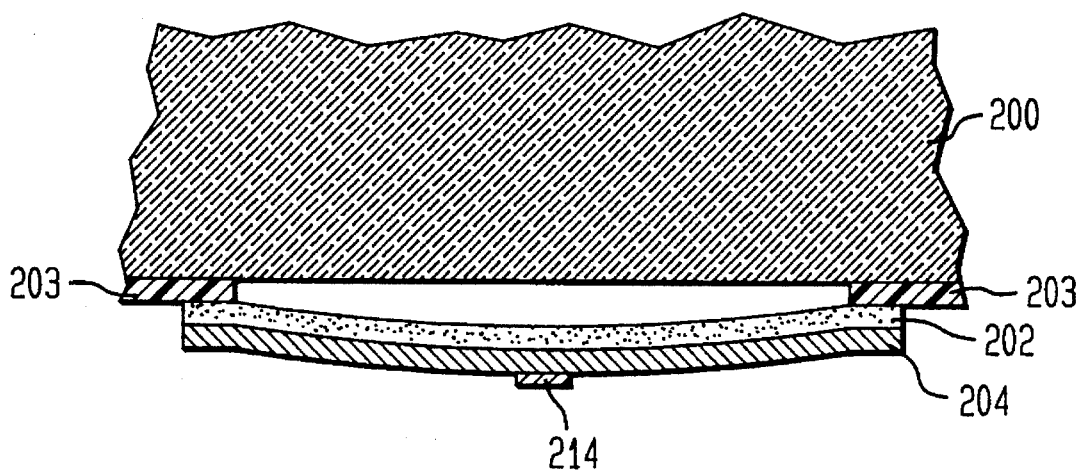

FIGS. 12a and 12b show yet another embodiment of the inventive microprobe. In this embodiment, the microprobe comprises a doubly supported beam rather than a cantilever. The beam is a bimorph structure comprising the aluminum layer 202 and the $SiO_2$ layer 204. (Alternatively, the beam may comprise a piezoelectric material.) However, the beam is supported at both ends by the $SiO_2$ layer 203. The processing steps for producing the doubly supported beam shown in FIGS. 12a and 12b are essentially identical to those used to form the cantilever-type microprobe, except that two ends are left fixed to the silicon substrate 200 instead of one fixed end and one free end.

FIG. 12a shows the beam in a relaxed state while FIG. 12b shows the actuated state wherein heat has been supplied to the bimorph structure. The beam is caused to bow outwards and brings the metal contact 214 into contact with a contact pad. The force exerted on the contact pad by the metal contact 214 is considerably higher (for a given heater power level or for a given temperature) for a beam microprobe such as that shown in FIGS. 12a and 12b, than for a cantilever microprobe.

While the invention has been described by reference to specific embodiments, this was for purposes of illustration only. Numerous alternative embodiments and applications of the invention will be apparent to those skilled in the art and are considered to be within the scope of the invention.

We claim:

1. A wafer probe card comprising a substrate, a region of said substrate comprising an array of closely spaced microcantilevers suspended over and separated from said substrate, each of said microcantilevers comprising a first layer of metallic material and a second layer of non-metallic material on top of said first layer, said first layer having a coefficient of thermal expansion which is greater than that of said second layer, said first layer being closer to said substrate than said second layer, and at least one contact zone extending from each microcantilever in a direction away from said substrate, and a separate lead for each of said microcantilevers which supplies electricity and heat to its associated microcantilever, whereby each microcantilever in said array can be individually actuated by supplying heat to said microcantilever thereby causing said microcantilever to bend away from said substrate.

2. The wafer probe card of claim 1 wherein each contact zone comes to a point having a radius of curvature which is less than about 1 nm.

3. The wafer probe card of claim 1 wherein each of said microcantilevers is about 100–600 μm long and about 10–30 μm wide, and each of said microcantilevers is separated from adjacent microcantilevers by a distance of about 10 μm.

4. The wafer probe card of claim 1 wherein each contact zone is made from silicon.

5. The wafer probe card of claim 4 wherein each contact zone is metal clad.

6. The wafer probe card of claim 1 further comprising a separate probe line connected to each microprobe.

7. A structure, comprising a substrate, a region of said substrate comprising an array of closely spaced microprobes, each of said microprobes comprising a cantilever extending outwardly in a plane from a base area of said substrate, an actuating element in contact with said cantilever which causes a free end of said cantilever to bend away from said base area, and at least one contact zone extending from said cantilever in a direction which is perpendicular to said plane of said cantilever, so that when said free end of said cantilever is caused to bend away from said base area, said contact zone traverses an arc and is brought into contact with a sample, each of said microprobes being thermally and electrically isolated from other microprobes in said array, whereby each microprobe in said array can be individually actuated.

8. The structure of claim 7 wherein said cantilever comprises a first layer of a first material and a second layer of a second material, said first and second materials having different co-efficients of thermal expansion, and wherein said actuating element is a heating element which supplies heat to said cantilever to cause it to bend.

9. The structure of claim 7 wherein said cantilever comprises a piezoelectric material, and wherein said actuating element supplies electric current to said cantilever to cause it to bend.

10. The structure of claim 7 wherein said microprobe is a monolithic structure.

11. The structure of claim 7 wherein said microprobe is microscopic in size.

12. The structure of claim 7 wherein said cantilever is suspended over said substrate and is separated therefrom by a gap.

13. The structure of claim 12 wherein said gap is on the order of 10 μm wide.

14. The structure of claim 7 wherein said contact zone comes to a point having a radius of curvature which is less than about 1 nm.

15. The structure of claim 14 wherein said point has a radius of curvature of about 0.5 μm.

16. The structure of claim 7 wherein said contact zone is planar.

17. The structure of claim 7 wherein said cantilever is about 100–600 μm long and about 10–30 μm wide.

18. The structure of claim 7 wherein said cantilever is about 200 μm long and about 20 μm wide.

19. The structure of claim 7 wherein said contact zone is made from silicon.

20. The structure of claim 19 wherein said contact zone is covered with a layer of tungsten.

21. The structure of claim 19 wherein said contact zone is covered with a layer of silicon carbide.

22. The structure of claim 19 wherein said contact zone is covered with conducting diamond.

23. The structure of claim 8 wherein said first layer is made from a metal and said second layer is made from silicon oxide.

24. The structure of claim 23 wherein said metal is aluminum.

25. The structure of claim 23 further comprising a third layer of a third material immediately under said first layer of aluminum.

26. The structure of claim 25 wherein said third material is palladium.

27. The structure of claim 8 wherein said heating element comprises a line of a conductive material.

28. The structure of claim 8 wherein said heating element comprises a line of polysilicon.

29. The structure of claim 7 wherein said contact zone is about 5 μm high.

30. The structure of claim 7 comprising a plurality of contact zones extending from said cantilever, all of said contact zones being electrically in common, each of said contact zones extending from said cantilever in a direction which is perpendicular to said plane of said cantilever.

31. The structure of claim 7 comprising a plurality of contact zones extending from said cantilever, each of said contact zones being electrically isolated from the remaining contact zones.

32. The structure of claim 31 having four electrically isolated contact zones, said four contact zones being arranged in a square and being spaced apart from each other by a distance of less than about 1.0 μm.

33. The structure of claim 8 wherein said contact zone is planar, and wherein an additional layer of material is placed on top of said first layer in the region of said contact zone, said additional layer of material having a coefficient of thermal expansion which is different from said coefficient of thermal expansion of said first material, so that in the region of said contact zone said cantilever is caused to bend in a direction which is opposite to the bending direction of said cantilever when heat is supplied to said cantilever.

34. The structure of claim 7 wherein said contact zone is planar and is more compliant then said cantilever.

35. The structure of claim 34 wherein said contact zone is narrower in width than said cantilever.

36. The structure of claim 7 wherein said cantilever is suspended over and separated from said substrate, wherein said cantilever comprises a first layer of a metallic material and a second layer of a nonmetallic material on top of said first layer, said first layer being closer to said substrate than said second layer and having a coefficient of thermal expansion greater than that of said second layer, so that said cantilever bends away from said substrate when heat is supplied to said cantilever.

* * * * *